(12) United States Patent
Eguchi

(10) Patent No.: US 10,792,919 B2
(45) Date of Patent: Oct. 6, 2020

(54) METHOD FOR MANUFACTURING PIEZOELECTRIC ELEMENT AND METHOD FOR MANUFACTURING INK JET HEAD

(71) Applicant: Konica Minolta, Inc., Tokyo (JP)

(72) Inventor: Hideyuki Eguchi, Hachioji (JP)

(73) Assignee: Konica Minolta, Inc., Tokyo (JP)

( * ) Notice: Subject to any disclaimer, the term of this patent is extended or adjusted under 35 U.S.C. 154(b) by 0 days.

(21) Appl. No.: 16/304,571

(22) PCT Filed: May 11, 2017

(86) PCT No.: PCT/JP2017/017913
§ 371 (c)(1),
(2) Date: Nov. 26, 2018

(87) PCT Pub. No.: WO2017/203995
PCT Pub. Date: Nov. 30, 2017

(65) Prior Publication Data
US 2019/0210368 A1 Jul. 11, 2019

(30) Foreign Application Priority Data
May 27, 2016 (JP) .................................. 2016-106191

(51) Int. Cl.
*B41J 2/14* (2006.01)
*H01L 41/187* (2006.01)
(Continued)

(52) U.S. Cl.
CPC ........... *B41J 2/14201* (2013.01); *B41J 2/161* (2013.01); *B41J 2/1623* (2013.01); *B41J 2/1628* (2013.01);
(Continued)

(58) Field of Classification Search
CPC .... B41J 2/14201; B41J 2/1631; B41J 2/1646; B41J 2/1632; B41J 2/1645; B41J 2/1628;
(Continued)

(56) References Cited

FOREIGN PATENT DOCUMENTS

JP 2002316417 A2 10/2002
JP 2006175599 A * 7/2006
(Continued)

OTHER PUBLICATIONS

IP.com search (Year: 2019).*
(Continued)

*Primary Examiner* — Lisa Solomon
(74) *Attorney, Agent, or Firm* — Rankin, Hill & Clark LLP

(57) ABSTRACT

A method for manufacturing a piezoelectric actuator (21 *a*) as a piezoelectric element includes: an electrode forming step of forming a lower electrode (24) on a base body (27) including at least a support substrate (22); a film forming step of forming a piezoelectric thin film (25) on the lower electrode (24); a patterning step of patterning the piezoelectric thin film (25) by removing a part of the piezoelectric thin film (25); and a polishing step of polishing the support substrate (22). The polishing step is performed before the patterning step. In the film forming step, the piezoelectric thin film (25) is formed such that a ratio of the peak intensity of a pyrochlore phase to the sum of the peak intensities of (100) orientation, (110) orientation, and (111) orientation of a perovskite phase, obtained by 2θ/θ measurement of X-ray diffraction, is 100 ppm or less.

20 Claims, 9 Drawing Sheets

(51) Int. Cl.
  *B41J 2/16*      (2006.01)
  *H01L 41/09*     (2006.01)
  *H01L 41/316*    (2013.01)
  *H01L 41/332*    (2013.01)

(52) U.S. Cl.
  CPC .......... *B41J 2/1631* (2013.01); *B41J 2/1632* (2013.01); *B41J 2/1642* (2013.01); *B41J 2/1645* (2013.01); *B41J 2/1646* (2013.01); *H01L 41/0973* (2013.01); *H01L 41/1876* (2013.01); *H01L 41/316* (2013.01); *H01L 41/332* (2013.01); *B41J 2202/03* (2013.01)

(58) Field of Classification Search
  CPC ........ B41J 2/1623; B41J 2/1642; B41J 2/161; B41J 2202/03; H01L 41/332; H01L 41/316; H01L 41/0973; H01L 41/1876
  See application file for complete search history.

(56) References Cited

FOREIGN PATENT DOCUMENTS

| | | |
|---|---|---|
| JP | 2006175599 A2 | 7/2006 |
| JP | 2013247216 A2 | 12/2013 |
| JP | 2015099864 A2 | 5/2015 |
| WO | 2014162999 A1 | 10/2014 |
| WO | 2015163070 A1 | 10/2015 |
| WO | WO-2015163070 A1 * | 10/2015 |

OTHER PUBLICATIONS

Machine Translation of WO2015163070, Eguchi, Hideyuki, Piezoelectric Element, Method for Producing Piezoelectric Element, Piezoelectric Acuator, Inkjet Head, and Inkjet Printer, Paragraphs [0003, 0031-0033, 0054-0055, 0064-0079] (Year: 2015).*
Machine Translation of JP2006175599, Fujii, Takamitsu, "Liquid Delivering Head and Its Manufacturing Method", Paragraph [0058] (Year: 2006).*
Silicon-On-Insulator Wikipedia Article (Year: 2019).*
IP.com search (Year: 2020).*

* cited by examiner

METHOD FOR MANUFACTURING PIEZOELECTRIC ELEMENT AND METHOD FOR MANUFACTURING INK JET HEAD

TECHNICAL FIELD

The present invention relates to a method for manufacturing a piezoelectric element and a method for manufacturing an ink jet head.

BACKGROUND ART

In recent years, a piezoelectric body has been used as an electromechanical transducer to be applied to a drive element, a sensor, or the like. Such a piezoelectric body is expected to be applied to a micro electro mechanical systems (MEMS) element by being formed as a thin film on a substrate such as silicon (Si). Such a MEMS element is used as, for example, an actuator of an ink jet head.

In an ink jet head, a pressure chamber for containing ink is formed in a substrate, and a piezoelectric thin film is formed on the substrate via an insulating film, an electrode, or the like. According to design of the ink jet head, the height (depth) of the pressure chamber is, for example, 50 to 300 µm. Meanwhile, the initial thickness of the substrate is, for example, 400 to 700 µm. Therefore, it is necessary to polish the substrate so as to obtain the above height of the pressure chamber.

Here, in a step of forming a piezoelectric thin film, the temperature is 600 to 800° C. which is very high. Therefore, the substrate is easily warped in a state where the substrate is thin. Therefore, if the substrate is polished first and then a piezoelectric thin film is formed on the thinned substrate at a high temperature, a temperature distribution of the piezoelectric thin film is nonuniform in a plane due to warp of the substrate at a high temperature, and the Elm quality of the piezoelectric thin film is nonuniform in the plane. Therefore, in many cases, a piezoelectric thin film is formed on a thick substrate first, and patterned into a desired shape, and then the substrate is polished. Polishing a substrate alter a piezoelectric thin film is patterned in this way is also referred to as "post-polishing" here.

FIG. 8 is a cross-sectional view illustrating a process of manufacturing a conventional ink jet head, including post-polishing. First, a silicon on insulator (SOI) substrate 101 is prepared as a substrate. The SOI substrate 101 is a substrate having a structure in which an oxide film 101*c* is sandwiched between two silicon (Si) substrates 101*a* and 101*b*. Next, the SOT substrate 101 is thermally oxidized to form oxide films 102*a* and 102*b* on the front and back surfaces of the SOI substrate 101, respectively. Then, a lower electrode 103 and a piezoelectric thin film 104 are formed in this order on the oxide film 102*a*.

Subsequently, a mask 105 is formed on the piezoelectric thin film 104, and the piezoelectric thin film 104 is patterned. In other words, a portion of the piezoelectric thin film 104 not covered with the mask 105 is removed by etching. Thereafter, an upper electrode 106 is formed on the lower electrode 103 so as to cover the piezoelectric thin film 104.

Next, a mask 107 is formed on the upper electrode 106, and the upper electrode 106 is patterned. In other words, a portion of the upper electrode 106 not covered with the mask 107 is removed by etching. Thereafter, the back surface of the SOI substrate 101 is polished, and the SOI substrate 101 is thinned (post-polishing). Then, a mask 108 is formed on the back surface of the SOI substrate 101, and a portion of the SOI substrate 101 not covered with the mask 108 is removed by etching to form a pressure chamber 109. As a result, a piezoelectric element 110 as an actuator is obtained. Finally, the SOT substrate 101 is bonded to a nozzle substrate 120 with an adhesive or the like to complete an ink jet head 200. At this time, both the substrates are bonded to each other such that the pressure chamber 109 of the SOI substrate 101 communicates with a nozzle hole 120*a* of the nozzle substrate 120.

As described above, a technique for manufacturing an ink jet head by post-polishing is also disclosed, for example, in Patent Literature 1.

CITATION LIST

Patent Literature

Patent Literature 1: JP 2002-316417 A (refer to claims 1 and 15, paragraphs [0037], [0038], and [0087], FIG. 5(*d*), and the like)

SUMMARY OF INVENTION

Technical Problem

However, in post-polishing, as illustrated in FIG. 9, a load (shear stress) is applied to an edge 104*a* of the patterned piezoelectric thin film 104 in a direction along a surface of the SOI substrate 101 during polishing (because a polishing direction is along the surface of the SOI substrate 101). Therefore, adhesion between the edge 104*a* of the patterned piezoelectric thin film 104 and the lower electrode 103 which is an underlying layer thereof is easily reduced. As a result, at the time of repetitively driving the manufactured piezoelectric element 110, the edge 104*a* of the piezoelectric thin film 104 is easily peeled off from an underlying layer thereof, and reliability of the piezoelectric element 110, in addition, reliability of the ink jet head 200 is reduced.

If a pyrochlore phase which is a metastable layer is present widely in a crystal of the piezoelectric thin film 104, the pyrochlore phase reduces adhesion at an interface between the piezoelectric thin film 104 and an underlying layer thereof. Therefore, there is also a concern that the piezoelectric thin film 104 may be peeled off at the time of repetitive driving and reliability of the piezoelectric element 110 may be thereby reduced. Therefore, it is also necessary to properly define a pyrochlore ratio in the crystal of the piezoelectric thin film 104.

The present invention has been achieved in order to solve the above-described problems. An object of the present invention is to provide a method for manufacturing a piezoelectric element capable of suppressing peeling of a piezoelectric thin film at the time of repetitively driving the element to improve reliability by properly defining a timing of polishing a substrate and a pyrochlore ratio in a crystal of the piezoelectric thin film, and a method for manufacturing an ink jet head.

Solution to Problem

A method for manufacturing a piezoelectric element according to an aspect of the present invention includes: an electrode forming step of forming an electrode on a base body including at least a substrate; a film forming step of forming a piezoelectric thin film on the electrode; a patterning step of patterning the piezoelectric thin film by removing a part of the piezoelectric thin film; and a polishing step of polishing the substrate. The polishing step is performed before the patterning step. In the film forming step, the piezoelectric thin film is formed such that a ratio of the peak intensity of a pyrochlore phase to the sum of the peak intensities of (100) orientation, (110) orientation, and (111) orientation of a perovskite phase, obtained by 2θ/θ measurement of X-ray diffraction, is 100 ppm or less.

Advantageous Effects of Invention

According to the above-described manufacturing method, it is possible to suppress peeling of a piezoelectric thin film from an underlying layer thereof at the time of repetitively driving a manufactured piezoelectric element, and to improve reliability of the piezoelectric element, in addition, reliability of an ink jet head.

DESCRIPTION OF EMBODIMENTS

An embodiment of the present invention will be described below with reference to the drawings.

Incidentally, in the present specification, in a case where a numerical range is described as A to B, the numerical range includes the lower limit A and, the upper limit B.

[Configuration of Ink Jet Printer]

Figure 1:
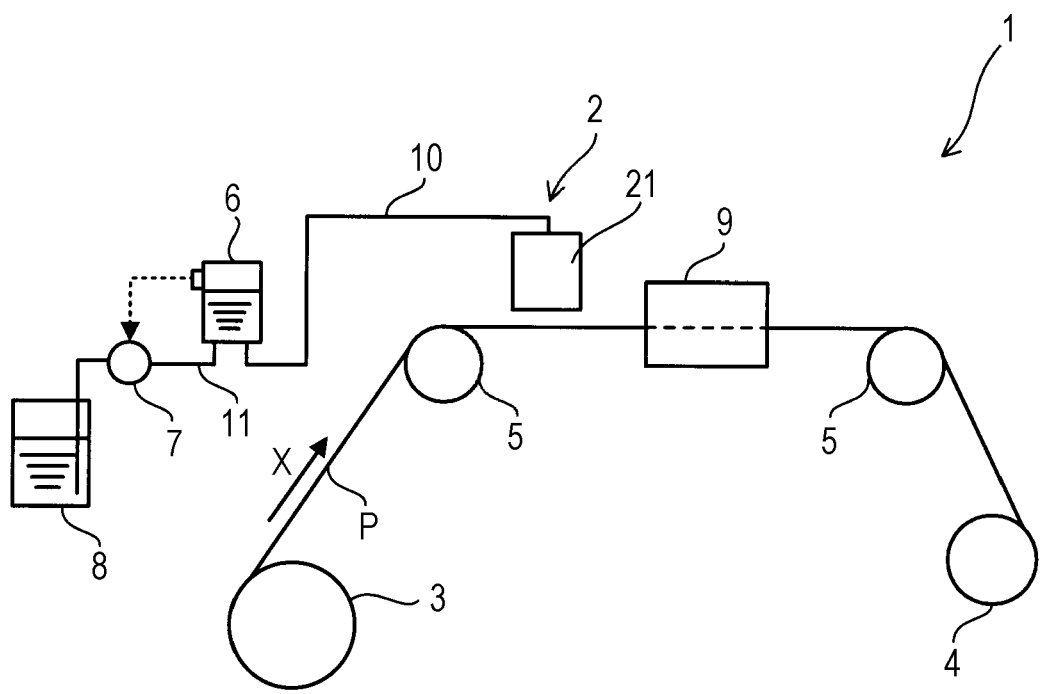
FIG. 1 is an explanatory diagram illustrating a schematic configuration of an inkjet printer according to an embodiment of the present invention.

FIG. 1 is an explanatory diagram illustrating a schematic configuration of an ink jet printer 1 according to the present embodiment. The ink jet printer 1 is a so-called line head method ink jet recording apparatus in which inkjet heads 21 are disposed in a line shape in a width direction of a recording medium in an ink jet head unit 2.

The ink jet printer 1 includes the ink jet head unit 2, a delivering roll 3, a winding roll 4, two back rolls 5 and 5, an intermediate tank 6, a liquid feeding pump 7, a storage tank 8, and a fixing mechanism 9.

The ink jet head unit 2 ejects ink from the ink jet head 21 toward a recording medium P, forms (draws) an image based on image data, and is disposed near one of the back rolls 5. A plurality of the ink jet heads 21 may be disposed corresponding to inks of different colors. Note that details of the ink jet head 21 will be described later.

The delivering roll 3, the winding roll 4, and the back rolls 5 are members each having a columnar shape rotatable about an axis. The delivering roll 3 delivers the elongated recording medium P wound several times around a circumferential surface toward a position facing the ink jet head unit 2. The delivering roll 3 is rotated by a driving means (not illustrated) such as a motor to deliver and convey the recording medium P in the X direction in FIG. 1.

The winding roll 4 is delivered from the delivering roll 3 and winds the recording medium P onto winch ink has been ejected by the ink jet head unit 2 around a circumferential surface.

Each of the back rolls 5 is disposed between the delivering roll 3 and the winding roll 4. One of the back rolls 5 located on an upstream side of the recording medium P in a conveying direction conveys the recording medium P delivered by the delivering roll 3 toward a position facing the ink jet head unit 2 while winding the recording medium P around a part of a circumferential surface and supporting the recording medium P. The other of the back rolls 5 conveys the recording medium P from the position facing, the ink jet head unit 2 toward the winding roll 4 while winding the recording medium P around a part of a circumferential surface and supporting the recording medium P.

The intermediate tank 6 temporarily stores ink supplied from the storage tank 8. The intermediate tank 6 is connected to an ink tube 10, adjusts a back pressure of ink in the ink jet head 21, and supplies the ink to the ink jet head 21.

The liquid feeding pump 7 supplies ink stored in the storage tank 8 to the intermediate tank 6, and is disposed in the middle of a supply tube 11. The ink stored in the storage tank 8 is pumped up by the liquid feeding pump 7 and supplied to the intermediate tank 6 via the supply tube 11.

The fixing mechanism 9 fixes ink ejected onto the recording medium P by the ink jet head unit 2 to the recording medium P. The fixing mechanism 9 includes a heater for heating and fixing the ejected ink to the recording medium P, a UV lamp for curing the ejected ink by irradiating the ink with UV (ultraviolet light), and the like.

In the above-described configuration, the recording medium P delivered from the delivering roll 3 is conveyed to a position facing the ink jet head unit 2 by one of the back rolls 5, and ink is ejected from the ink jet head unit 2 onto the recording medium P. Thereafter, the ink ejected onto the recording medium P is fixed by the fixing mechanism 9, and the recording medium P after the ink is fixed is wound by the winding roll 4. In this manner, in the line head method ink jet printer 1, while the ink jet head unit 2 is kept stationary, ink is ejected while the recording medium P is conveyed, and an image is formed on the recording medium P.

Note that the ink jet printer 1 may be configured to form an image on a recording medium by a serial head method. In the serial head method, while a recording medium is conveyed, an ink jet head is moved in a direction perpendicular to a direction in which the recording medium is conveyed, and ink is ejected to form an image. In this case, the ink jet head moves in a width direction of the recording medium while being supported by a structure such as a carriage. In addition to an elongated recording medium, a sheet-shaped recording medium cut into a predetermined size (shape) in advance may also be used as the recording medium.

[Configuration of Ink Jet Head]

Figure 2A:
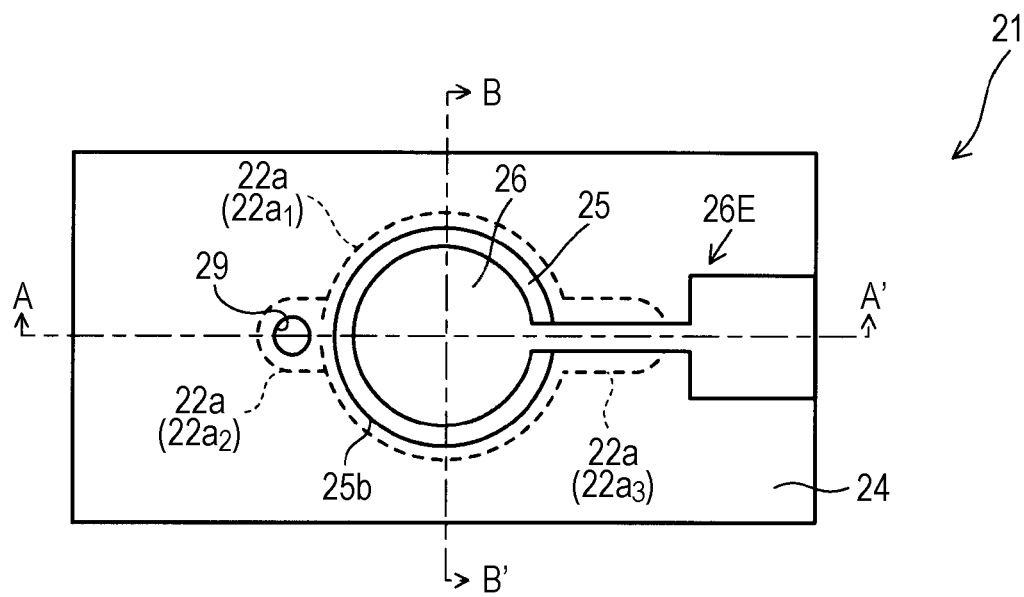
FIG. 2A is a plan view illustrating a schematic configuration of an ink jet head included in the inkjet printer.
Figure 2B:
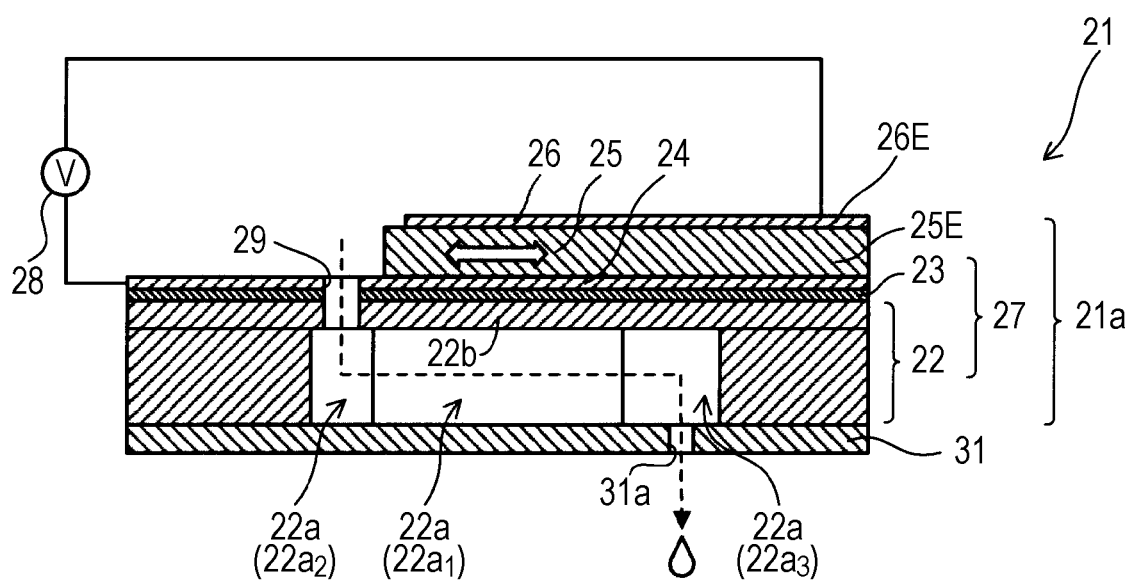
FIG. 2B is a cross-sectional view of the ink jet head, taken along line A-A' in FIG. 2A.

Next, a configuration of the ink jet head 21 will be described. FIG. 2A is a plan view illustrating a schematic configuration of the ink jet head 21, and FIG. 2B is a cross-sectional view of the ink jet head 21, taken along line A-A' in FIG. 2A. The ink jet head 21 is formed by bonding a nozzle substrate 31 to a piezoelectric actuator 21a. The piezoelectric actuator 21a includes a thermal oxide film 23, a lower electrode 24, a piezoelectric thin film 25, and an upper electrode 26 in this order on a support substrate 22 including a plurality of pressure chambers 22a (openings), and constitutes a piezoelectric element as a device. In addition, the piezoelectric actuator 21a includes a base body 27. The base body 27 is formed of a laminate including, for example, the support substrate 22 and the thermal oxide film 23. Incidentally, it is needless to say that the base body 27 is not limited to the laminate including the support substrate 22 and the thermal oxide film 23 as long as including at least the support substrate 22.

The support substrate 22 is a substrate for supporting the piezoelectric thin film 25 and the like, and is formed of a semiconductor substrate made of a single crystal Si simple substance or an SOI substrate, having a thickness of, for example, about 50 to 300 μm. Note that FIG. 2B illustrates a case where the support substrate 22 is formed of the SOI substrate. The support substrate 22 is adjusted to the above thickness by polishing a Si substrate or an SOI substrate having a thickness of, for example, about 750 μm. Note that it is only required to adjust the thickness of the support substrate 22 appropriately depending on a device to which the support substrate 22 is applied.

The SOI substrate is obtained by bonding two Si substrates to each other via an oxide film. An upper wall (wall of the pressure chamber 22a located on a side on which the piezoelectric thin film 25 is formed) of each of the pressure chambers 22a of the support substrate 22 constitutes a diaphragm 22b to be a driven film, and is displaced (vibrated) due to drive (expansion and contraction) of the piezoelectric thin film 25 to apply a pressure to ink in each of the pressure chambers 22a. That is, the diaphragm 22b is disposed so as to cover the pressure chambers 22a in the support substrate 22, and is vibrated by expansion and contraction of the piezoelectric thin film 25.

The thermal oxide film 23 is formed of silicon oxide ($SiO_2$) having a thickness of, for example, about 0.1 μm and is formed in order to protect and insulate the support substrate 22.

The lower electrode 24 is a common electrode disposed commonly to the plurality of pressure chambers 22a, and is constituted by laminating a titanium (Ti) layer and a platinum (Pt) layer. The Ti layer is formed in order to improve adhesion between the thermal oxide film 23 and the Pt layer. The thickness of the Ti layer is, for example, about 0.02 μm, and the thickness of the Pt layer is, for example, about 0.1 μm.

The piezoelectric thin film 25 is formed of a ferroelectric thin film containing lead zirconate titanate (PZT), and is disposed corresponding to each of the pressure chambers 22a. PZT is made of lead (Pb), zirconium (Zr), titanium (Ti), and oxygen (O). The film thickness of the piezoelectric thin film 25 is, for example, 1 μm or more and 5 μm or less. As described above, the piezoelectric thin film 25 is thin, and therefore the small piezoelectric actuator 21a can be achieved.

Figure 3:
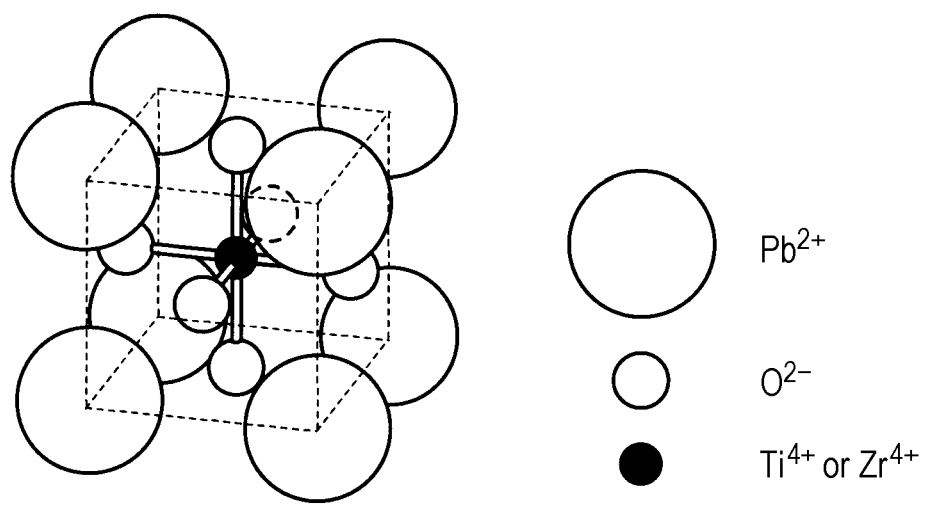
FIG. 3 is an explanatory diagram schematically illustrating a crystal structure of PZT.

PZT exhibits a favorable piezoelectric effect when having the perovskite type structure illustrated in FIG. 3. Here, the perovskite type structure means an $ABO_3$ type crystal structure ideally having a cubic nit lattice and constituted by a metal (for example, Pb) atom arranged at each apex (A site) of the cubic crystal, a metal (for example, Zr or Ti) atom arranged at a body center (B site), and an oxygen O atom arranged at each face center of the cubic crystal. The crystal having the perovskite structure also includes a tetragonal, an orthorhombus, a rhombohedron, and the like obtained by distorting a cubic crystal. Incidentally, the piezoelectric thin film 25 only needs to contain PZT, and an additive (lanthanum (La), niobium (Nb), or the like) may be added to PZT.

As described above, by inclusion of PZT exhibiting favorable piezoelectric characteristics in the piezoelectric thin film 25, it is possible to achieve the piezoelectric actuator 21a suitable for the ink jet head 21.

As a method for forming the piezoelectric thin film 25 on the support substrate 22, it is possible to use various methods including a chemical film forming method such as a chemical vapor deposition (CVD) method, a physical method such as a sputtering method or an ion plating method, a liquid phase growing method such as a sol-gel method, and a printing method. A high temperature is required for crystallization of a piezoelectric material. Therefore, Si is used for the support substrate 22.

The piezoelectric thin film 25 is substantially circular in a plan view above the pressure chambers 22a and drawn along the lower electrode 24 from upper portions of the pressure chambers 22a to upper portions of side walls of the pressure chambers 22a. The portion where the piezoelectric thin film 25 is drawn is referred to as a piezoelectric thin film drawing portion 25E. Such a piezoelectric thin film drawing portion 25E is disposed in order to draw the upper electrode 26 formed on the piezoelectric thin film 25 to the outside of the pressure chambers 22a. That is, the piezoelectric thin film drawing portion 25E constitutes a ground layer for drawing the upper electrode 26 to the outside of the pressure chambers 22a. The width of the piezoelectric thin film drawing portion 25E (width in a direction perpendicular to a drawing direction) is narrower than the width of the piezoelectric thin film 25 above the pressure chambers 22a and is expanded at a position above the side walls of the pressure chambers 22a. Note that the planar shape of the piezoelectric thin film 25 above the pressure chambers 22a is not limited to the circular shape, but may be another shape.

The upper electrode 26 is an individual electrode disposed corresponding to each of the pressure chambers 22a, and is constituted by laminating a Ti layer and a Pt layer in a shape (size) not protruding from the piezoelectric thin film 25. The Ti layer is formed in order to improve adhesion between the piezoelectric thin film 25 and the Pt layer. The thickness of the Ti layer is, for example, about 0.2 μm, and the thickness of the Pt layer is, for example, about 0.1 to 0.2 tam. The upper electrode 26 is disposed so as to sandwich the piezoelectric thin film 25 between the upper electrode 26 and the lower electrode 24. Note that a layer made of gold (Au) may be formed in place of the Pt layer.

The upper electrode 26 is substantially circular in a plan view above the pressure chambers 22a and drawn along the piezoelectric thin film 25 from upper portions of the pressure chambers 22a to upper portions of the side walls of the pressure chambers 22a. The portion where the upper electrode 26 is drawn is referred to as an upper electrode drawing portion 26E. The width of the upper electrode drawing portion 26E (width in a direction perpendicular to a drawing direction) is narrower than the width of the upper electrode 26 above the pressure chamber 22a and is expanded at a position (portion connected to a drive circuit 28) above the side walls of the pressure chambers 22a. Note that the planar shape of the upper electrode 26 above the pressure chambers 22a is not limited to the circular shape, but may be another shape.

The piezoelectric thin film 25 is driven based on a voltage (drive signal) applied from the drive circuit 28 to the lower electrode 24 and the upper electrode 26. The piezoelectric actuator 21a is formed by two-dimensionally arranging the piezoelectric thin film 25, the pressure chambers 22a, and the like.

Each of the pressure chambers 22a includes a main chamber $22a_1$ and sub chambers $22a_2$ and $22a_3$ each having a smaller volume than that of the main chamber $22a_1$. The main chamber $22a_1$ is a portion (space) to which a pressure is mainly applied by driving of the piezoelectric thin film 25. The sub chamber $22a_2$ is a space communicating with the main chamber $22a_1$ and guides ink supplied from an ink supply path 29 to the main chamber $22a_1$. The ink supply path 29 penetrates the diaphragm 22h and communicates with the above-described ink tube 10 (refer to FIG. 1). As a result, ink is supplied to the pressure chambers 22a from the intermediate tank 6 via the ink tube 10 and the ink supply path 29, and contained in the pressure chambers 22a. Note that ink may be supplied to the pressure chambers 22a not through the individual ink supply path 29 but through a common flow path common to the pressure chambers 22a. The sub chamber $22a_3$ is located on the opposite side of the main chamber $22a_2$ to the sub chamber 22a, and communicates with the main chamber $22a_1$ in the support substrate 22. In addition, a common circulation flow path may be disposed in the support substrate 22, and ink in the pressure chambers 22a may be circulated between the pressure chambers 22a and the outside via the common circulation flow path.

The nozzle substrate 31 is bonded to the opposite side of the support substrate 22 of the piezoelectric actuator 21a to the side on which the piezoelectric thin film 25 is formed. A nozzle hole 31a (ejection hole) is formed in the nozzle substrate 31. The nozzle hole 31a communicates with each of the pressure chambers 22a (for example, the auxiliary chamber $22a_3$) formed in the support substrate 22. As a result, ink contained in each of the pressure chambers 22a can be ejected to the outside from the nozzle hole 31a as ink droplets.

In the above-described configuration, when a voltage is applied from the drive circuit 28 to the lower electrode 24 and the upper electrode 26, the piezoelectric thin film 25 expands and contracts in a direction perpendicular to a thickness direction (direction parallel to a surface of the support substrate 22) depending on a difference in potential between the lower electrode 24 and the upper electrode 26. Then, a curvature is generated in the diaphragm 22b due to a difference in length between the piezoelectric thin film 25 and the diaphragm 22b, and the diaphragm 22b is displaced (bent or vibrated) in the thickness direction.

Therefore, if ink is contained in each of the pressure chambers 22a, a pressure wave is propagated to the ink in each of the pressure chambers 22a by vibration of the above-described diaphragm 22b, and the ink in each of the pressure chambers 22a is ejected from the nozzle hole 31a to the outside as ink droplets.

In the present embodiment, the piezoelectric thin film 25 is located inside the outer shape of each of the pressure chambers 22a in a plan view except for the above-described piezoelectric thin film drawing portion 25E. If the diaphragm 22b covering the pressure chambers 22a is entirely covered with the piezoelectric thin film 25 above the pressure chambers 22a, the diaphragm 22b is constrained by the piezoelectric thin film 25, and therefore the amount of vibration (displacement amount) of the diaphragm 22b may be lowered. By disposing the piezoelectric thin film 25 as described above, the diaphragm 22b is not entirely covered with the piezoelectric thin film 25 above the pressure chambers 22a. Therefore, constraint of the diaphragm 22b by the piezoelectric thin film 25 is reduced, and reduction in the displacement amount of the diaphragm 22b can be avoided.

[Method for Manufacturing Ink Jet Head]

Figure 4:
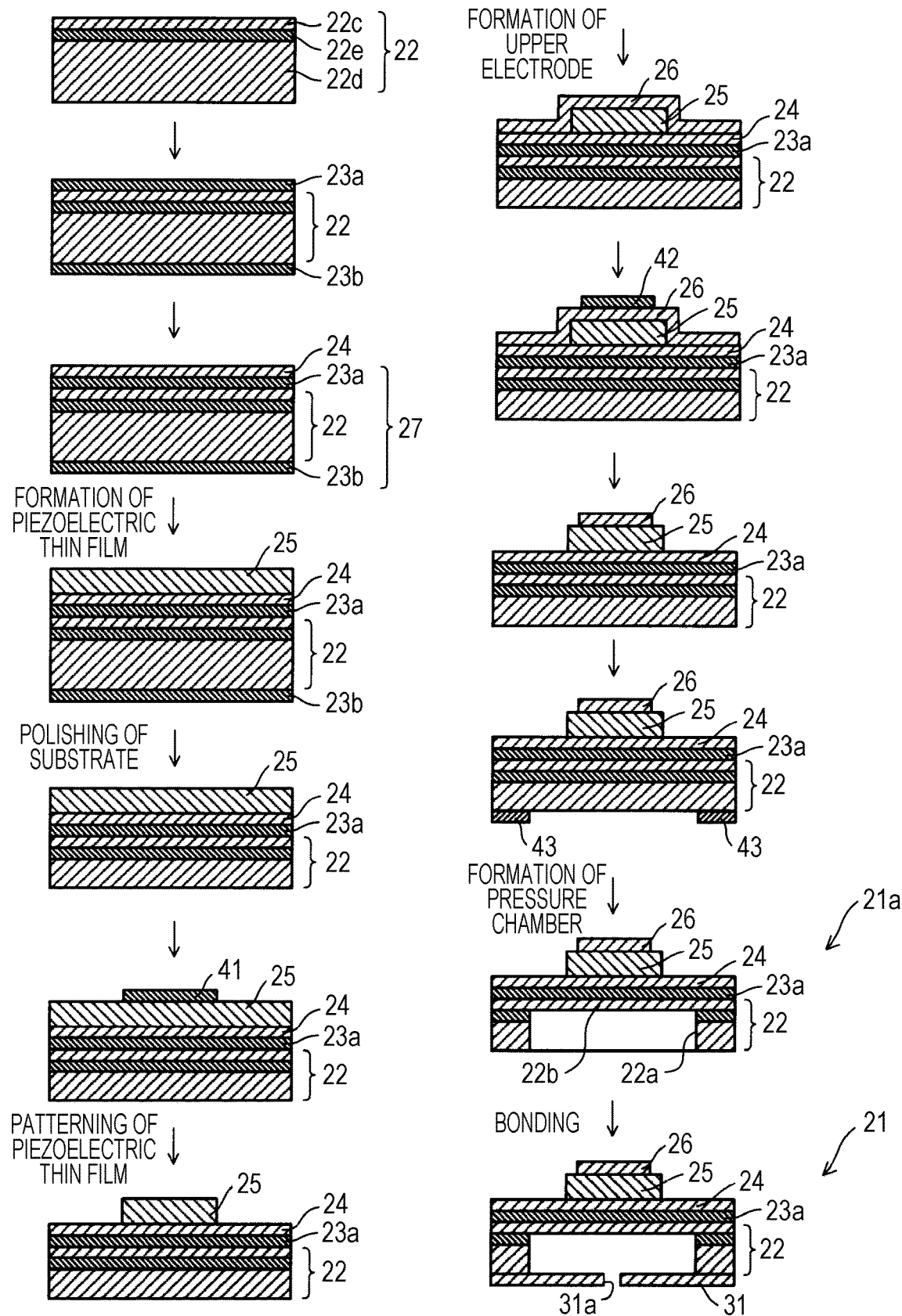
FIG. 4 is a cross-sectional view illustrating a process of manufacturing the ink jet head.

Next, a method for manufacturing the ink jet head 21 including the piezoelectric actuator 21a as a piezoelectric element will be described below. FIG. 4 is a cross-sectional view illustrating a process of manufacturing the ink jet head 21. Note that FIG. 4 illustrates a cross section taken along line B-B' in FIG. 2A.

(1) First, the support substrate 22 is prepared. As the support substrate 22, crystalline silicon (Si) widely used for MEMS can be used. Here, a substrate having an SOI structure in which two Si substrates 22c and 22d are bonded to each other via an oxide film 22e is used. The thickness of the support substrate 22 is defined by standards and the like. In a case where the support substrate 22 has a size of 6 inches in diameter, the thickness of the support substrate 22 is about 600 μm.

(2) Next, the support substrate 22 is put in a heating furnace and held at about 1500° C. for a predetermined period of time to form thermal oxide films 23a and 23b made of $SiO_2$ and each having a thickness of, for example, 0.1 μm on surfaces of the Si substrates 22c and 22d, respectively.

(3) Then, a Ti layer (for example, 20 nm in thickness) and a Pt layer (for example, 100 nm in thickness) are sequentially formed on the thermal oxide film 23a which is one of the thermal oxide films by a sputtering method to form the lower electrode 24. In other words, the lower electrode 24 is formed on the base body 27 including the support substrate 22 and the thermal oxide films 23a and 23b (electrode forming step). Incidentally, in the present embodiment, the thermal oxide film 23b is removed at the same time as polishing the support substrate 22 which will be described later. Therefore, the base body 27 is finally constituted by the support substrate 22 and the thermal oxide film 23b.

Note that Pt film forming conditions are, for example, a film forming temperature: 400 to 500° C., a sputtering pressure: 0.4 Pa, an Ar flow rate: 20 sccm, and an RF power: 150 W. Pt has a self-orientation property and is oriented in (111) direction with respect to the support substrate 22. Note that iridium (Ir) may be used in place of Pt. Titanium oxide (TiOx) may be formed as an adhesion layer in place of Ti.

(4) Subsequently, the base body 27 is heated again to about 600° C. and the piezoelectric thin film 25 made of PZT is formed on the lower electrode 24 by a sputtering method (film forming step). Note that the piezoelectric thin film 25 is a polycrystalline film constituted by an aggregate of a plurality of crystals. Note that PZT lacks Pb due to evaporation of Pb when a film of PZT is formed at a high temperature. Therefore, a film of PZT is desirably formed by adding Pb as a PZT target in an amount which is excessive by a predetermined amount compared with stoichiometry (stoichiometric composition) in advance.

Here, the crystal of the piezoelectric thin film includes a perovskite phase having piezoelectricity and a pyrochlore phase which is a metastable phase and has no piezoelectricity. If a ratio of the pyrochlore phase in the crystal (pyrochlore ratio) increases, there is a concern that adhesion at an interface between the piezoelectric thin film and an underlying layer thereof (lower electrode) may be reduced. Therefore, in the present embodiment, by reducing the pyrochlore ratio in the crystal of the piezoelectric thin film 25, adhesion between the piezoelectric thin film 25 and an underlying layer thereof is improved. Note that the pyrochlore ratio in the crystal can be controlled by appropriately setting film forming conditions of the piezoelectric thin film 25. Details of the film forming conditions of the piezoelectric thin film 25 and the pyrochlore ratio will be described specifically in Examples described later.

(5) Next, the back surface (thermal oxide film 23b side) of the support substrate 22 is polished to thin the support substrate 22 (polishing step). This polishing step includes a step of mechanically polishing the support substrate 22 and a step of chemically and mechanically polishing the support substrate 22. Mechanical polishing is a technique of polishing a polishing target by a mechanical method using a grinder or the like, and is suitable for polishing a polishing target deeply and roughly. Meanwhile, chemical mechanical polishing is a technique of polishing a polishing target by using both a mechanical removal action by abrasive grains and a chemical action on a metal film surface by a polishing liquid (slurry), and is suitable for obtaining a smooth polished surface at a high speed. As described above, before the piezoelectric thin film 25 is patterned into a desired shape, the support substrate 22 is polished in advance (pre-polishing).

(6) After the support substrate 22 is polished, a photosensitive resin 41 is applied onto the piezoelectric thin film 25 by a spin coat method, exposed to light through a mask, and etched to remove an unnecessary portion of the photosensitive resin 41, and a patterning shape of the piezoelectric thin film 25 is transferred. Thereafter, a part of the piezoelectric thin film 25 is removed by a reactive ion etching method using the patterned photosensitive resin 41 as a mask, and the piezoelectric thin film 25 is patterned into a desired shape (patterning step).

(7) Next, a Ti layer (for example, 0.1 μm in thickness) and a Pt layer (for example, 0.2 μm in thickness) are sequentially formed on the lower electrode 24 so as to cover the piezoelectric thin film 25 by a sputtering method to form the upper electrode 26 which is an electrode different from the lower electrode 24 (different electrode forming step). Subsequently, a photosensitive resin 42 is applied onto the upper electrode 26 by a spin coat method, exposed to light through a mask, and etched to remove an unnecessary portion of the photosensitive resin 42, and a pattering shape of the upper electrode 26 is transferred. Thereafter, a part of the upper electrode 26 is removed by a reactive ion etching method using the patterned photosensitive resin 42 as a mask, and the upper electrode 26 is patterned into a desired shape.

(8) Subsequently, a photosensitive resin 43 is applied onto the back surface (thermal oxide film 23b side) of the support substrate 22 by a spin coat method, exposed to light through a mask, and etched to remove an unnecessary portion of the photosensitive resin 43, and a patterning shape of each of the pressure chambers 22a is transferred. Then, by using the patterned photosensitive resin 43 as a mask, an unnecessary portion of the support substrate 22 is removed or processed using a reactive ion etching method to form the pressure chambers 22a (pressure chamber forming step). In addition, a communication path (for example, an ink supply path 29) or the like is also formed. As a result, the piezoelectric actuator 21a as a piezoelectric element is completed.

(9) Finally, the support substrate 22 of the piezoelectric actuator 21a and the nozzle substrate 31 having the nozzle hole 31a are bonded to each other using an adhesive or the like such that the pressure chamber 22a of the support substrate 22 communicates with the nozzle hole 31a (bonding step). As a result, the ink jet head 21 is completed. Incidentally, by using an intermediate glass having a through hole at a position corresponding to the nozzle hole 31a, the support substrate 22 may be anodically bonded to the intermediate glass, and the intermediate glass may be anodically bonded to the nozzle substrate 31. In this case, the three members (support substrate 22, intermediate glass, and nozzle substrate 31) can be bonded to one another without using an adhesive.

EXAMPLES

Next, Examples of a method for manufacturing the above-described ink jet head 21 will be described together with Comparative Examples. Incidentally, in the following Examples and Comparative Examples, the methods are the same as the above-described manufacturing method except that different film forming conditions of a piezoelectric thin film and a different timing of polishing a substrate (preceding/following relationship with respect to patterning of a piezoelectric thin film) are used. Therefore, here, description will be made focusing on the film forming conditions of a piezoelectric thin film and the timing of polishing a substrate.

Example 1

A piezoelectric thin film made of PZT (Zr/Ti=52/48) was formed on a lower electrode by a sputtering method under the following film forming conditions. That is, the film forming temperature was 620° C., a Pb ratio of a target (molar ratio of Pb to the sum of a molar ratio of Zr and a molar ratio of Ti) was 1 to 1.3, and flow rate of oxygen ($O_2$)/flow rate of argon (Ar) was 1%. By adjusting the Pb ratio of a target within the above range, the ratio of the pyrochlore phase in a crystal can be reduced Note that the timing of polishing a support substrate is before polishing a piezoelectric thin film, which is pre-polishing, as described above.

Example 2

Example 2 is similar to Example 1 except that a piezoelectric thin film was formed by setting a film forming temperature of PZT to 600° C. and setting $O_2$ flow rate/Ar flow rate to 1 to 5%.

Example 3

Example 3 is similar to Example 1 except that a piezoelectric thin film was formed by setting a film forming temperature of PZT to 600° C.

Example 4

Example 4 is similar to Example 1 except that a piezoelectric thin film was formed by setting a film forming temperature of PZT to 580° C., setting a Pb ratio of a target to 1.1 to 1.3, and setting $O_2$ flow rate/Ar flow rate to 1 to 5%.

Example 5

Example 5 is similar to Example 1 except that a piezoelectric thin film made of lead lanthanum zirconate titanate (PLZT, La: 0.8 mol %, Zr/Ti=60/40) was formed on a lower electrode by a sputtering method under the following film forming conditions. That is, a film forming temperature was 580° C., a Pb ratio of a target was 1.1 to 1.30, and $O_2$ flow rate/Ar flow rate was 1 to 5%.

Example 6

Example 6 is similar to Example 1 except that a piezoelectric thin film was formed by setting a film forming temperature of PZT to 590° C.

Example 7

Example 7 is similar to Example 3 except that a piezoelectric thin film was formed by setting a film forming temperature of PZT to 590° C. and setting a Pb ratio of a target to 1%.

Comparative Example 1

Figure 8:
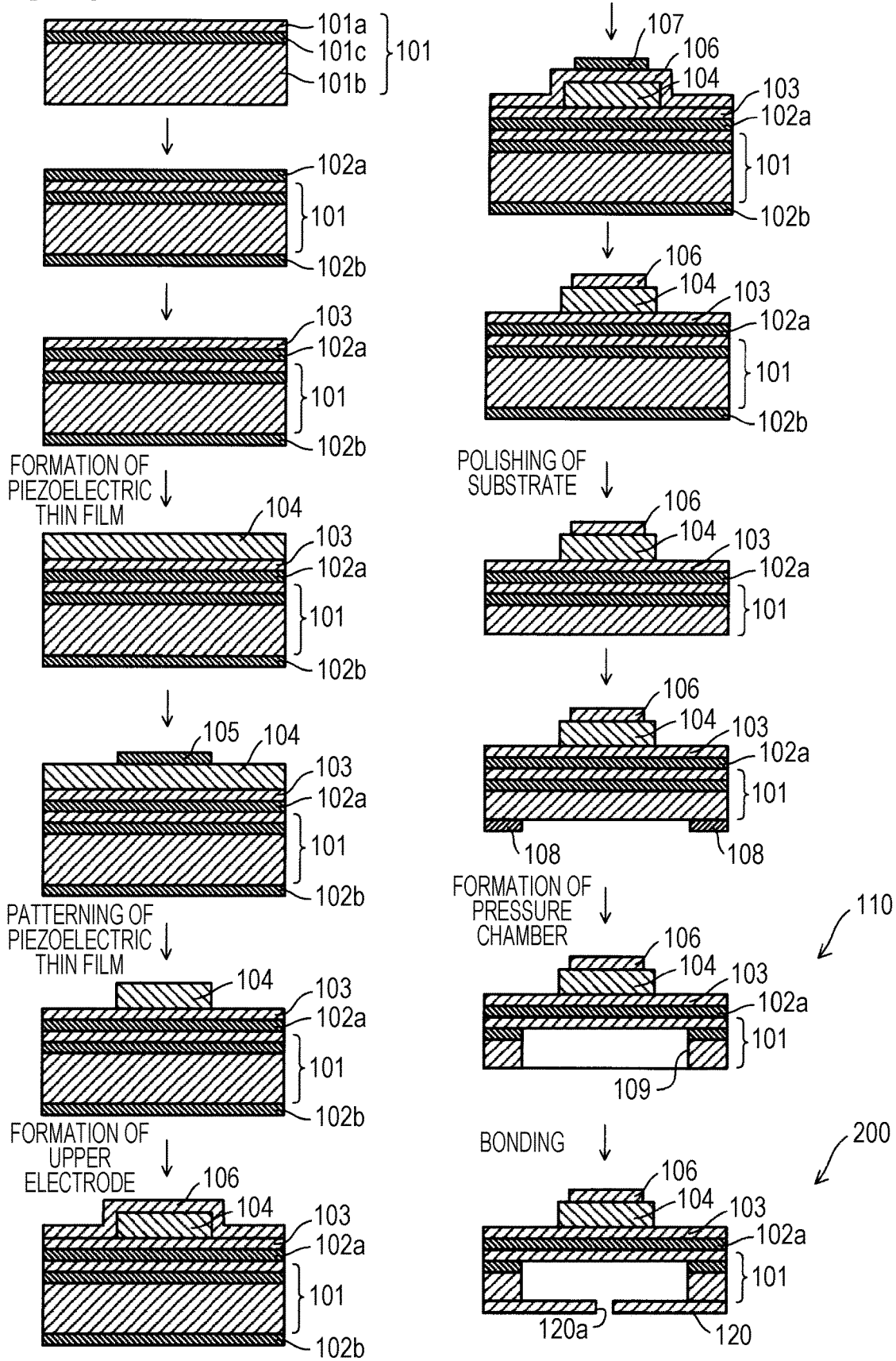
FIG. 8 is a cross-sectional view illustrating a process of manufacturing a conventional ink jet head.
Figure 9:
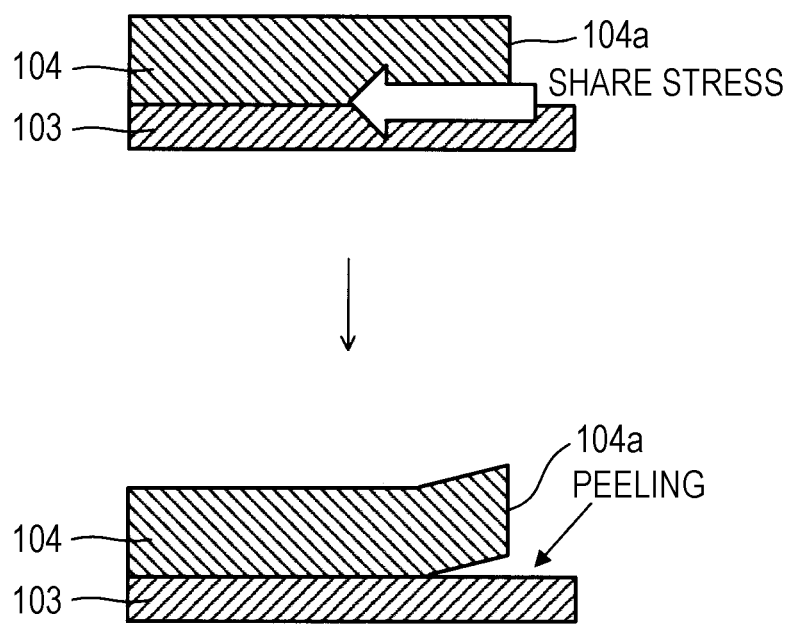
FIG. 9 is an explanatory diagram schematically illustrating how an edge of a piezoelectric thin film is peeled off from a underlying layer thereof by a shear stress at the time of polishing a substrate in manufacturing a conventional ink jet head.

Comparative Example 1 is similar to Example 1 except that a piezoelectric thin film was formed by setting a film forming temperature of PZT to 635° C. and a timing of polishing a support substrate was after patterning the piezoelectric thin film (refer to FIG. 8).

Comparative Example 2

Comparative Example 2 is similar to Example 3 except that a timing of polishing a support substrate was after patterning a piezoelectric thin film (refer to FIG. 8).

Comparative Example 3

Comparative Example 3 is similar to Example 1 except that a film forming temperature of PZT was set to 590° C., $O_2$ flow rate/Ar flow rate was set to 1 to 5%, and a timing of polishing a support substrate was after patterning a piezoelectric thin film (refer to FIG. 8).

Comparative Example 4

Comparative Example 4 is similar to Example 1 except that a piezoelectric thin film was formed by setting a film forming temperature of PZT to 625° C. (polishing of a support substrate is pre-polishing).

(Evaluation)

<Pyrochlore Ratio>

Figure 5:
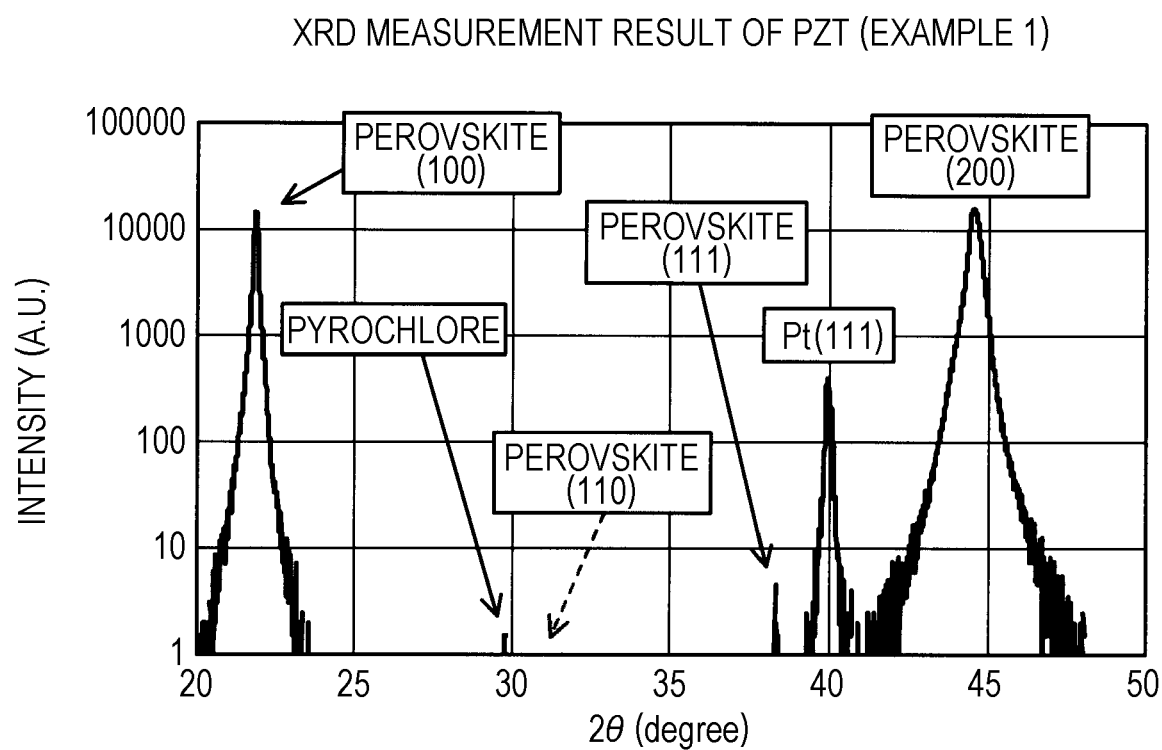
FIG. 5 is an explanatory graph illustrating a spectrum obtained by performing 2θ/θ measurement of X-ray diffraction on a piezoelectric thin film formed in Example 1.

The piezoelectric thin films formed under the film forming conditions of Examples 1 to 7 and Comparative Examples 1 to 4 were evaluated by X-ray diffraction (XRD). FIG. 5 illustrates a spectrum obtained by performing 2θ/θ measurement of XRD on a piezoelectric thin film, for example, formed in Example 1. Note that the intensity (diffraction intensity or reflection intensity) on the vertical axis in FIG. 5 is indicated in an arbitrary unit corresponding to a count per second (cps) of X-rays per second. The pyrochlore ratio in a crystal of a piezoelectric thin film was determined from each peak intensity obtained from such a spectrum.

Here, if the peak intensity of (100) orientation of the perovskite phase is represented by A1, the peak intensity of (110) orientation of the perovskite phase is represented by A2, the peak intensity of (111) orientation of the perovskite phase is represented by A3, the peak intensity of the pyrochlore phase is represented by Py, a pyrochlore ratio R is expressed by the following formula.

$R = Py/(A1+A2+A3)$

In other words, the pyrochlore ratio refers to a ratio of the peak intensity of the pyrochlore phase to the sum of the peak intensities of (100) orientation, (110) orientation, and (111) orientation of the perovskite phase, obtained by the 2θ/θ measurement.

<Film Stress (Internal Stress)>

For each of Examples 1 to 7 and Comparative Examples 1 to 4, warp of a substrate before and after formation of a piezoelectric thin film was measured, and a film stress α (Pa) of the piezoelectric thin film was determined based on the following known formula.

$$\sigma = \frac{1}{3d}\frac{Es}{1-vs}D^2\frac{h_2 - h_1}{a^2} \quad \text{[Numerical formula 1]}$$

Here, d represents a film thickness (m), D represents the thickness of a substrate (m). Es represents a longitudinal elastic modulus of the substrate (Pa), vs represents a Poisson's ratio of the substrate, a represents the radius of the substrate (m), $h_2$ represents warp (m) of the substrate after film formation, and $h_1$ represents warp (m) of the substrate before film formation. For example, in a case where the substrate is a Si or SOI substrate, Es is 160 (GPa), and vs is 0.2.

<Peeling Stress>

For each of Examples 1 to 7 and Comparative Examples 1 to 4, a high-frequency voltage of several kHz to 100 kHz was applied to a piezoelectric thin film on a diaphragm between a lower electrode and an upper electrode, and the piezoelectric thin film was repetitively driven. At this time, a starting voltage was set to about 20 V. A voltage was gradually increased from the starting voltage, and held for about 30 minutes to one hour while each voltage was applied.

A peeling state of a piezoelectric thin film was observed under each voltage condition. A peeling stress of the piezoelectric thin film was calculated from a voltage at which the piezoelectric thin film was peeled off and a shear stress acting on the piezoelectric thin film at the time of applying the voltage. Note that a shear stress acting on the piezoelectric thin film at the time of applying each voltage can be calculated by a piezoelectric constant $d_{31}$ (pm/V) calculated in advance and finite element analysis of a diaphragm structure.

Evaluation results of Examples 1 to 7 and Comparative Examples 1 to 4 are illustrated in Table 1.

TABLE 1

| | Polishing step<br>Pre: Polishing before patterning<br>Post: Polishing after patterning | Piezoelectric thin film | | | |
|---|---|---|---|---|---|
| | | Pyrochlore ratio<br>ppm (=×10⁻⁶) | Film stress<br>MPa | Peeling stress at the time of repetitive driving<br>MPa | Evaluation |
| Comparative Example 1 | Post | 200 | 85 | 30 | X |
| Comparative Example 2 | Post | 38 | 40 | 60 | X |
| Comparative Example 3 | Post | 50 | 60 | 50 | X |
| Comparative Example 4 | Pre | 105 | 70 | 90 | X |
| Example 1 | Pre | 95 | 70 | 100 | ○ |
| Example 2 | Pre | 45 | 45 | 110 | ◉ |
| Example 3 | Pre | 35 | 70 | 105 | ○ |
| Example 4 | Pre | 40 | 40 | 120 | ◉ |
| Example 5 | Pre | 30 | 50 | 115 | ◉ |
| Example 6 | Pre | 95 | 40 | 110 | ◉ |
| Example 7 | Pre | 35 | 45 | 115 | ◉ |

Note that evaluation criteria illustrated in Table 1 are as follows.

x: A peeling stress was less than 100 MPa, and peeling of a piezoelectric thin film was confirmed.

○: A peeling stress was 100 MPa or more and less than 110 MPa, and peeling of a piezoelectric thin film was hardly confirmed.

◉: A peeling stress was 110 MPa or more, and peeling of a piezoelectric thin film was not confirmed at all.

According to Table 1, in Comparative Examples 1 to 4, evaluation of a peeling stress at the time of repetitive driving is poor (x). It is considered that this is because polishing of a support substrate in Comparative Examples 1 to 3 is polishing after patterning of a piezoelectric thin film (post-polishing), and in post-polishing, a load in a shearing direction at the time of polishing is applied to an edge of the patterned piezoelectric thin film and adhesion between the edge of the piezoelectric thin film and an underlying layer thereof is thereby lowered. In addition, it is considered that this is because polishing of a support substrate in Comparative Example 4 is polishing before patterning of a piezoelectric thin film (pre-polishing), a pyrochlore ratio of the piezoelectric thin film exceeds 100 ppm, and the pyrochlore ratio is high, leading to reduction in adhesion.

Meanwhile, in Examples 1 to 7, evaluation of a peeling stress is favorable (◉ or ○). It is considered that this is because polishing of a support substrate in Examples 1 to 7 is pre-polishing, a pyrochlore ratio in a crystal of a piezoelectric thin film is a small value of 100 ppm or less, and therefore both reduction in adhesion due to a shear stress during polishing and reduction in adhesion due to the pyrochlore phase can be suppressed.

Particularly, in Examples 2 to 5 and 7, the pyrochlore ratio is an extremely small value of 45 ppm or less. Therefore, reduction in adhesion due to the pyrochlore phase is reliably suppressed, and it can be said that a peeling stress tends to increase (peeling hardly occurs). Furthermore, as in Examples 2, 4, and 5 to 7, if a film stress is 50 MPa or less, a peeling stress is 110 MPa or more. Therefore, adhesion between a piezoelectric thin film and an underlying layer thereof is further improved, and it can be said that it is more difficult for the piezoelectric thin film to be peeled off. Particularly, the pyrochlore ratio in Example 6 is the same as that in Example 1, and the pyrochlore ratio in Example 7 is the same as that in Example 3. However, a film stress is a low value of 50 MPa or less, and an evaluation result of a peeling stress is more favorable in both Examples 6 and 7. Therefore, it can be said that even if the pyrochlore ratio is the same, if the film stress is 50 MPa or less, the peeling stress can be further increased (it is possible to make it difficult to cause peeling).

As described above, the step of polishing a substrate is performed before the step of patterning a piezoelectric thin film. Therefore, an edge of a piezoelectric thin film after patterning is not influenced by a load in a shearing direction at the time of polishing a substrate. In other words, a piezoelectric thin film is not patterned and is solid at the time of polishing a substrate. Therefore, the load at the time of polishing the substrate is not locally applied to a portion located above a pressure chamber and corresponding to an edge of the piezoelectric thin film after patterning. As a result, it is possible to suppress reduction in adhesion between the edge of the piezoelectric thin film and an underlying layer thereof due to polishing of the substrate. Furthermore, in the film forming step, a piezoelectric thin film is formed such that a pyrochlore ratio in a crystal is 100 ppm or less. Therefore, it is also possible to suppress reduction in adhesion between the piezoelectric thin film and an underlying layer thereof due to the pyrochlore phase. Therefore, it is possible to suppress peeling of a piezoelectric thin film from an underlying layer thereof at the time of repetitively driving the manufactured piezoelectric element (piezoelectric actuator), and to improve reliability of the piezoelectric element.

In addition, if a film stress higher than 50 MPa is generated in advance in a piezoelectric thin film, the sum of this film stress and a stress generated at the time of driving (at the time of applying a voltage) is large, and it is considered that the piezoelectric thin film is more easily peeled off at the time of driving. Furthermore, if the film stress of the piezoelectric thin film is higher than 50 MPa, a high stress acts on an interface between the piezoelectric thin film and an electrode at all times during the process of manufacturing an element to make it easy to generate minute damage like a defect. It is considered that this makes it easy for the piezoelectric thin film to be peeled off at the time of driving.

However, by forming a piezoelectric thin film such that a film stress is 50 MPa or less in the film forming step, the sum of this film stress and a stress at the time of driving can be reduced, and generation of a defect due to a high film stress during the manufacturing process also can be suppressed. As a result, it is possible to enhance an effect of suppressing peeling of a piezoelectric thin film from an underlying layer thereof at the time of driving. Particularly, in pre-polishing, a substrate is thin and easily warped, and a film stress of a piezoelectric thin film tends to increase due to warp of the substrate. Therefore, it can be said that it is very effective in pre-polishing to form the piezoelectric thin film such that the film stress is 50 MPa or less.

Incidentally, in the above-described Examples, a film stress of a piezoelectric thin film is relieved by lowering a film forming temperature at the time of forming the piezoelectric thin film. However, in addition to this, for example, by adjusting a substrate potential or using a seed layer for a ground, the film stress of the piezoelectric thin film may be lowered.

In addition, by forming a piezoelectric thin film such that the pyrochlore ratio is 45 ppm or less in the film forming step, it is possible to reliably suppress reduction in adhesion between the piezoelectric thin film and an underlying layer thereof due to the pyrochlore phase. As a result, it is possible to reliably suppress peeling of a piezoelectric thin film at the time of repetitive driving and to reliably improve reliability of a piezoelectric element.

In addition, in the manufacturing method of the present embodiment, when an electrode (upper electrode) different from a lower electrode is formed on a piezoelectric thin film, a step of forming the upper electrode (different electrode forming step) is performed after a step of patterning a piezoelectric thin film (refer to FIG. 4). Since a step of polishing a substrate is performed before the step of patterning a piezoelectric thin film, of course, the different electrode forming step is performed after the step of polishing a substrate. As described above, in a case of manufacturing a piezoelectric element by forming an upper electrode on a patterned piezoelectric thin film after the step of polishing a substrate and the step of patterning the piezoelectric thin film, the above-described effects of the present embodiment can be obtained.

Furthermore, in the present embodiment, a pressure chamber is formed in a substrate after the step of patterning a piezoelectric thin film. In this case, the pressure chamber formed in the substrate can be used as an ink container, and therefore a piezoelectric element (piezoelectric actuator) suitable for an ink jet head can be achieved.

Furthermore, in the present embodiment, using the above-described method for manufacturing a piezoelectric element, finally, the substrate (support substrate) and a nozzle substrate are bonded to each other such that the pressure chamber communicates with a nozzle hole to form an ink jet head. As a result, in the ink jet lead, it is possible to suppress peeling of a piezoelectric thin film from an underlying layer thereof at the time of repetitive driving and to improve reliability.

[Other Method for Manufacturing Ink Jet Head]

Figure 6:
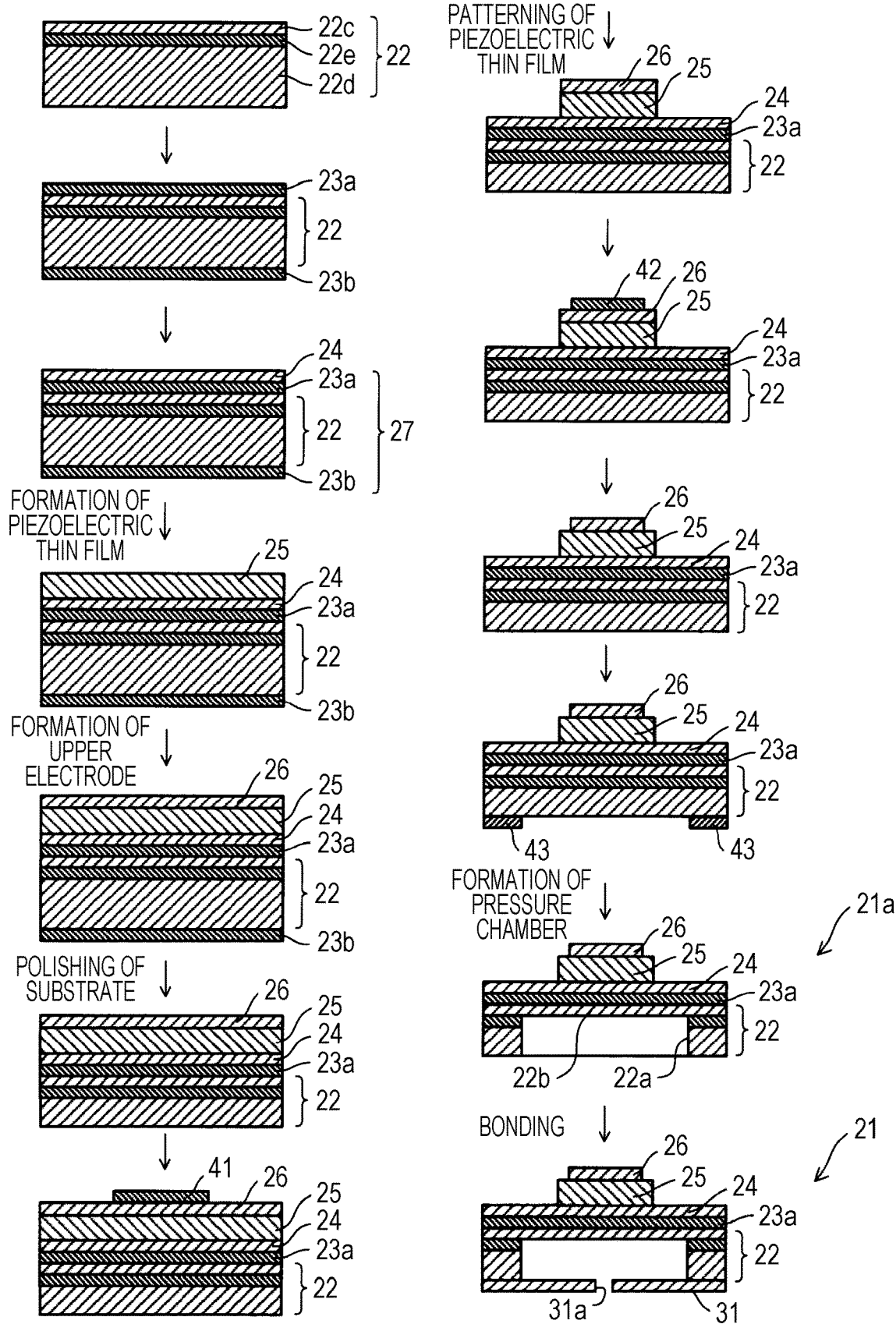
FIG. 6 is a cross-sectional view illustrating another process of manufacturing the ink jet head.

FIG. 6 is a cross-sectional view illustrating another process of manufacturing the ink jet head of the present embodiment. As illustrated in FIG. 6, the different electrode forming step of forming a different electrode (upper electrode 26) on the piezoelectric thin film 25 may be performed before the step of patterning the piezoelectric thin film 25. The step of polishing the support substrate 22 may be performed after the different electrode forming step and before the patterning step. Note that the other steps are similar to those in FIG. 4.

Even in a case where the support substrate 22 is polished after formation of the upper electrode 26 and before patterning of the piezoelectric thin film 25, thereafter, a load in a shearing direction at the time of polishing a substrate is not applied to an edge of the patterned piezoelectric thin film 25. Therefore, it is possible to suppress reduction in adhesion between the edge of the piezoelectric thin film 25 and an underlying layer thereof (lower electrode 24) due to polishing of the support substrate 22.

In other words, formation of the upper electrode 26 may be performed after polishing of the support substrate 22 (refer to FIG. 4) or before polishing of the support substrate 22 (refer to FIG. 6) as long as polishing of the support substrate 22 is performed before patterning of the piezoelectric thin film 25.

[Other Configuration of Ink Jet Head]

Figure 7:
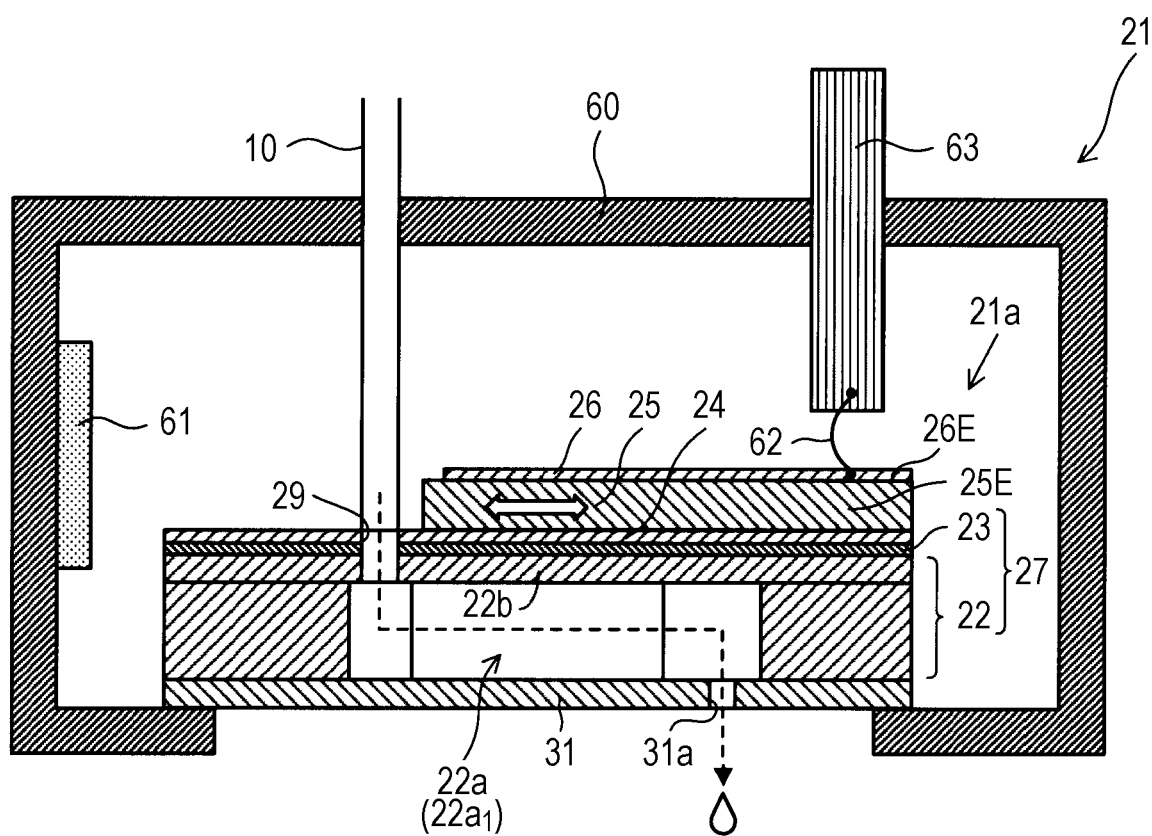
FIG. 7 is a cross-sectional view illustrating another configuration of the ink jet head.

FIG. 7 is a cross-sectional view illustrating another configuration of the ink jet lead 21. As illustrated in FIG. 7, the ink jet head 21 desirably further includes a sealing case 60 for sealing the piezoelectric thin film 25. In other words, the method for manufacturing the ink jet head 21 desirably further includes a sealing step of sealing the piezoelectric thin film 25 with the sealing case 60. The sealing case 60 is attached to the nozzle substrate 31 with an adhesive or the like, and this secures airtightness inside the sealing case 60.

In the configuration of FIG. 7, the ink supply path 29 communicates with the ink tube 10 penetrating the sealing case 60. The upper electrode drawing portion 26E is connected to a flexible printed circuit (FPC) 63 via a wire 62, and the FPC 63 is connected to the drive circuit 28 (refer to FIG. 2B). As a result, it is possible to apply a voltage from the drive circuit 28 to the upper electrode 26 via the FPC 63 and the upper electrode drawing portion 26E. Note that it is assumed that the lower electrode 24 is also connected to the FPC 63 via a wire (not illustrated). A method for connecting the upper electrode 26 (upper electrode drawing portion 26E) and the lower electrode 24 to the FPC 63 is not limited to the wire bonding (ball bonding) method. For example, a bump (protrusion) may be formed on each of the electrodes, the bumps may be brought into contact with a bump on the FPC 63 side, and at least one of these bumps may be melted for connection.

By sealing the piezoelectric thin film 25 with the sealing case 60 as described above, in an environment where the ink jet head 21 is used, arrival of moisture in the atmosphere at the piezoelectric thin film 25 and infiltration of the moisture thereinto is hindered. As a result, dielectric breakdown of the piezoelectric thin film 25 due to the moisture can be suppressed, and the ink jet head 21 with higher reliability can be achieved.

Incidentally, in order to suppress dielectric breakdown of the piezoelectric thin film 25 due to moisture in the sealing case 60, by disposing a moisture absorbing material 61 in the sealing case 60 or introducing dr) nitrogen thereinto, the inside of the sealing case 60 is desirably kept so as to have a relative humidity of, for example, 1% or less.

[Regarding Piezoelectric Material]

In the above description, the case where PZT or PLZT is used as a piezoelectric material constituting the piezoelectric thin film 25 has been described, but the piezoelectric material is not limited to these materials. That is, the piezoelectric thin film 25 may be constituted by a perovskite compound containing the following elements at an A site or a B site of an $ABO_3$ type perovskite type structure.

That is, the element of the A site of the $ABO_3$ type perovskite type structure contains lead (Pb) and may further contain at least one of barium (Ba), lanthanum (La), strontium (Sr), bismuth (Bi), lithium (Li), sodium (Na), calcium (Ca), cadmium (Cd), magnesium (Mg), and potassium (K). In addition, the element of the B site contains zirconium (Zr) and titanium (Ti), and may further contain at least one of vanadium (V), niobium (Nb), tantalum (Ta), chromium (Cr), molybdenum (Mo), tungsten (W), manganese (Mn), scandium (Sc), cobalt (Co), copper (Cu), indium (In), tin (Sn), gallium (Ga), cadmium (Cd), iron (Fe), and nickel (Ni).

Furthermore, the piezoelectric material to be used may be a non-lead type piezoelectric material not containing Pb. Examples of the non-lead type piezoelectric material include barium strontium titanate (BST), strontium bismuth tantalate (SBT), barium titanate ($BaTiO_3$), and potassium sodium niobate (($K,Na)NbO_3$).

[Supplement]

The embodiment of the present invention has been described above. However, the scope of the present invention is not limited thereto, and various modifications can be made without departing from the gist of the invention.

The method for manufacturing a piezoelectric element and the method for manufacturing an ink jet head according to the present embodiment described above can be expressed as follows, and it can be said that the following effects are obtained by these methods.

The method for manufacturing a piezoelectric element according to the present embodiment includes: an electrode forming step of forming an electrode on a base body including at least a substrate; a film forming step of forming a piezoelectric thin film on the electrode; a patterning step of patterning the piezoelectric thin film by removing a part of the piezoelectric thin film; and a polishing step of polishing the substrate. The polishing step is performed before the patterning step. In the film forming step, the piezoelectric thin film is formed such that a ratio of the peak intensity of the pyrochlore phase to the sum of the peak intensities of (100) orientation, (110) orientation, and (111) orientation of a perovskite phase, obtained by 2θ/θ measurement of X-ray diffraction, is 100 ppm or less.

According to the above-described manufacturing method, an electrode (for example, a lower electrode) and a piezoelectric thin film are formed on a base body including at least a substrate, and the substrate is polished and thinned before the piezoelectric thin film is patterned. Polishing the substrate before patterning the piezoelectric thin film is also referred to as "pre-polishing". The piezoelectric thin film is patterned after the substrate is thinned by pre-polishing. Therefore, no load in a shearing direction at the time of polishing the substrate is applied to an edge of the piezoelectric thin film after patterning. As a result, it is possible to suppress reduction in adhesion between the edge of the piezoelectric thin film and an underlying layer thereof (for example, an electrode) due to polishing of the substrate. Furthermore, the pyrochlore ratio in a crystal of the piezoelectric thin film is a small value of 100 ppm or less. Therefore, it is also possible to suppress reduction in adhesion between the piezoelectric thin film and an underlying layer thereof (for example, an electrode) due to the pyrochlore phase in the crystal. Therefore, it is possible to suppress peeling of the piezoelectric thin film from the underlying layer thereof at the time of repetitively driving the manufactured piezoelectric element, and to improve reliability of the piezoelectric element.

In the film forming step, the piezoelectric thin film is desirably formed such that a film stress is 50 MPa or less. In a case where the film stress of the piezoelectric thin film is a small value of 50 MPa or less, a stress acting on an interface between the piezoelectric thin film and an underlying layer thereof (for example, an electrode) at the time of driving can be minimized. As a result, it is possible to enhance an effect of suppressing peeling of a piezoelectric thin film from an underlying layer thereof at the time of driving.

In the film forming step, the piezoelectric thin film is desirably formed such that the ratio is 45 ppm or less. The pyrochlore ratio in a crystal of the piezoelectric thin film is a small value of 45 ppm or less. Therefore, it is possible to reliably suppress reduction in adhesion between the piezoelectric thin film and an underlying layer thereof due to the pyrochlore phase in the crystal. As a result, it is possible to reliably suppress peeling of a piezoelectric thin film at the time of repetitive driving and to reliably improve reliability of a piezoelectric element.

The piezoelectric thin film may contain lead zirconate titanate. Lead zirconate titanate (PZT) has a perovskite type structure and exhibits favorable piezoelectric characteristics, and therefore can achieve a piezoelectric element suitable for an actuator of an ink jet head or the like.

The thickness of the piezoelectric thin film is desirably 1 μm or more and 5 μm or less. Since the piezoelectric thin film is thin, a small piezoelectric element can be achieved. In the configuration in which the piezoelectric thin film is thin, the above-described effects can be obtained.

The polishing step desirably includes a step of chemically and mechanically polishing the substrate. By chemically and mechanically polishing the substrate, a polishing surface of the substrate can be polished and smoothed precisely.

The method for manufacturing a piezoelectric element may further include a different electrode forming step of forming a different electrode on the piezoelectric thin film, and the different electrode forming step may be performed after the patterning step. In a case of manufacturing a piezoelectric element by forming a different electrode (for example, an upper electrode) on a patterned piezoelectric thin film after the piezoelectric thin film is patterned, the above-described effects can be obtained.

The method for manufacturing a piezoelectric element may further include a different electrode forming step of forming a different electrode on the piezoelectric thin film. The different electrode forming step may be performed before the patterning step, and the polishing step may be performed after the different electrode forming step and before the patterning step. Even after formation of a different electrode (for example, an upper electrode), by polishing a substrate before patterning a piezoelectric thin film, thereafter, a load in a shearing direction at the time of polishing the substrate is not applied to an edge of the patterned piezoelectric thin film. Therefore, it is possible to suppress reduction in adhesion between the edge of the piezoelectric thin film and an underlying layer thereof due to polishing of the substrate.

The method for manufacturing a piezoelectric element may include a step of forming a pressure chamber in the substrate after the patterning step. In this case, the pressure chamber formed in the substrate can be used as an ink container, and therefore a piezoelectric element suitable for an ink jet head can be achieved.

The method for manufacturing an ink jet head according to the present embodiment is a method for manufacturing an ink jet head, including the above-described method for manufacturing a piezoelectric element. When the substrate is a support substrate, the method includes a bonding step of bonding a nozzle substrate having a nozzle hole to the support substrate such that the nozzle hole communicates with the pressure chamber formed in the support substrate.

The ink jet head is constituted by bonding the support substrate to the nozzle substrate such that the pressure chamber communicate with the nozzle hole. According to the above-described method for manufacturing a piezoelectric element, peeling of the piezoelectric thin film from an underlying layer thereof can be suppressed at the time of repetitively driving the piezoelectric element, and reliability of the piezoelectric element can be improved. Therefore, reliability can be improved also in an ink jet head manufactured by a method including the method for manufacturing a piezoelectric element.

The method for manufacturing an ink jet head may further include a sealing step of sealing the piezoelectric thin film with a sealing case. By sealing the piezoelectric thin film with a sealing case, arrival of moisture in the atmosphere of an environment where an ink jet head is used at the piezoelectric thin film is hindered. As a result, dielectric breakdown of the piezoelectric thin film due to the moisture can be suppressed, and an ink jet head with higher reliability can be achieved.

INDUSTRIAL APPLICABILITY

The present invention can be used for manufacturing a piezoelectric element applied to, for example, an actuator of an ink jet head.

REFERENCE SIGNS LIST

21 Ink jet head
21a Piezoelectric actuator (piezoelectric element)
22 Support substrate (substrate)
22a Pressure chamber
24 Lower electrode (electrode)
25 Piezoelectric thin film
26 Upper electrode (different electrode)
27 Base body
31 Nozzle substrate
31a Nozzle hole
60 Sealing case

The invention claimed is:

1. A method for manufacturing a piezoelectric element, comprising:
    forming an electrode on a base body including at least a substrate;
    forming a piezoelectric thin film on the electrode;
    patterning the piezoelectric thin film by removing a part of the piezoelectric thin film; and
    polishing the substrate, wherein
    the polishing is performed before the patterning, and
    in the forming a piezoelectric thin film,
    the piezoelectric thin film is formed such that a ratio of a peak intensity of a pyrochlore phase to a sum of peak intensities of (100) orientation, (110) orientation, and (111) orientation of a perovskite phase, obtained by 2θ/θ measurement of X-ray diffraction, is 100 ppm or less.

2. The method for manufacturing a piezoelectric element according to claim 1, wherein in the forming a piezoelectric thin film, the piezoelectric thin film is formed such that a film stress is 50 MPa or less.

3. The method for manufacturing a piezoelectric element according to claim 1, wherein in the forming a piezoelectric thin film, the piezoelectric thin film is formed such that the ratio is 45 ppm or less.

4. The method for manufacturing a piezoelectric element according to claim 1, wherein the piezoelectric thin film contains lead zirconate titanate.

5. The method for manufacturing a piezoelectric element according to claim 1, wherein the piezoelectric thin film has a thickness of 1 μm or more and 5 μm or less.

6. The method for manufacturing a piezoelectric element according to claim 1, wherein the polishing includes chemically and mechanically polishing the substrate.

7. The method for manufacturing a piezoelectric element according to claim 1, further comprising forming a different electrode on the piezoelectric thin film, wherein
    the forming a different electrode is performed after the patterning.

8. The method for manufacturing a piezoelectric element according to claim 1, further comprising forming a different electrode on the piezoelectric thin film, wherein
    the forming a different electrode is performed before the patterning, and
    the polishing is performed after the forming a different electrode and before the patterning.

9. The method for manufacturing a piezoelectric element according to claim 7, further comprising forming a pressure chamber in the substrate after the patterning.

10. A method for manufacturing an ink jet head, comprising the method for manufacturing a piezoelectric element according to claim 9, further comprising
    when the substrate is a support substrate,
    bonding a nozzle substrate having a nozzle hole to the support substrate such that the nozzle hole communicates with the pressure chamber formed in the support substrate.

11. The method for manufacturing an ink jet head according to claim 10, further comprising sealing the piezoelectric thin film with a sealing case.

12. The method for manufacturing a piezoelectric element according to claim 2, wherein in the forming a piezoelectric thin film, the piezoelectric thin film is formed such that the ratio is 45 ppm or less.

13. The method for manufacturing a piezoelectric element according to claim 2, wherein the piezoelectric thin film contains lead zirconate titanate.

14. The method for manufacturing a piezoelectric element according to claim 2, wherein the piezoelectric thin film has a thickness of 1 μm or more and 5 μm or less.

15. The method for manufacturing a piezoelectric element according to claim 2, wherein the polishing includes chemically and mechanically polishing the substrate.

16. The method for manufacturing a piezoelectric element according to claim 2, further comprising forming a different electrode on the piezoelectric thin film, wherein
    the forming a different electrode is performed after the patterning.

17. The method for manufacturing a piezoelectric element according to claim 2, further comprising forming a different electrode on the piezoelectric thin film, wherein
    the forming a different electrode is performed before the patterning, and
    the polishing is performed after the forming a different electrode and before the patterning.

18. The method for manufacturing a piezoelectric element according to claim 3, wherein the piezoelectric thin film contains lead zirconate titanate.

19. The method for manufacturing a piezoelectric element according to claim 3, wherein the piezoelectric thin film has a thickness of 1 μm or more and 5 μm or less.

20. The method for manufacturing a piezoelectric element according to claim 3, wherein the polishing includes chemically and mechanically polishing the substrate.

* * * * *